United States Patent
Okamoto et al.

(10) Patent No.: US 11,140,784 B2
(45) Date of Patent: Oct. 5, 2021

(54) PRINTED WIRING BOARD AND MANUFACTURING METHOD THEREOF

(71) Applicants: SUMITOMO ELECTRIC PRINTED CIRCUITS, INC., Shiga (JP); SUMITOMO ELECTRIC INDUSTRIES, LTD., Osaka (JP)

(72) Inventors: Kohei Okamoto, Shiga (JP); Kousuke Miura, Shiga (JP); Hiroshi Ueda, Shiga (JP); Shoichiro Sakai, Osaka (JP); Maki Ikebe, Osaka (JP)

(73) Assignees: SUMITOMO ELECTRIC PRINTED CIRCUITS, INC., Shiga (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/495,217

(22) PCT Filed: Dec. 22, 2017

(86) PCT No.: PCT/JP2017/046201
§ 371 (c)(1),
(2) Date: Sep. 18, 2019

(87) PCT Pub. No.: WO2018/211733
PCT Pub. Date: Nov. 22, 2018

(65) Prior Publication Data
US 2020/0022262 A1 Jan. 16, 2020

(30) Foreign Application Priority Data
May 16, 2017 (JP) .............................. JP2017-097663

(51) Int. Cl.
*H05K 3/10* (2006.01)
*H05K 1/02* (2006.01)
*H05K 3/24* (2006.01)

(52) U.S. Cl.
CPC .......... *H05K 3/108* (2013.01); *H05K 1/0296* (2013.01); *H05K 3/241* (2013.01); *H05K 3/244* (2013.01);
(Continued)

(58) Field of Classification Search
CPC ...... H05K 3/108; H05K 1/0296; H05K 3/241; H05K 3/244; H05K 2201/0347; H05K 2203/072
(Continued)

(56) References Cited

U.S. PATENT DOCUMENTS

| 2017/0135206 A1 | 5/2017 | Ueda et al. |
| 2018/0054900 A1 | 2/2018 | Ueda et al. |
| 2018/0145256 A1* | 5/2018 | Yang ........................ G06F 3/041 |

FOREIGN PATENT DOCUMENTS

| JP | H01-099454 | 4/1989 |
| JP | 2011-171423 | 9/2011 |

(Continued)

*Primary Examiner* — Tremesha S Willis
(74) *Attorney, Agent, or Firm* — IPUSA, PLLC

(57) ABSTRACT

A printed wiring board includes a base film having insulation properties and a conductive pattern including multiple wiring portions laminated so as to run on at least one surface of the base film, wherein each wiring portion includes a first conductive portion and a second conductive portion coating an outer surface of the first conductive portion, wherein an average width of each wiring portion is 10 μm or greater to 50 μm or smaller, and an average thickness of the second conductive portion is 1 μm or greater to smaller than 8.5 μm. A method for manufacturing a printed wiring board includes a first conductive portion forming step of forming a first conductive portion forming each wiring portion by plating an opening of the resist pattern on the conductive foundation layer, a conductive foundation layer removing step, and a second conductive portion coating step.

8 Claims, 2 Drawing Sheets

(52) U.S. Cl.
   CPC ............... *H05K 2201/0347* (2013.01); *H05K 2203/072* (2013.01); *H05K 2203/0723* (2013.01)

(58) Field of Classification Search
   USPC ........................................................ 174/250
   See application file for complete search history.

(56) References Cited

FOREIGN PATENT DOCUMENTS

WO     2015/199116     12/2015
WO     2016/147993     9/2016

\* cited by examiner

PRINTED WIRING BOARD AND MANUFACTURING METHOD THEREOF

TECHNICAL FIELD

The present invention relates to a printed wiring board and a method for manufacturing the same. This application claims priority to Japanese Application No. 2017-97663, filed May 16, 2017, and incorporates all the descriptions described in the above Japanese application.

BACKGROUND ART

Printed wiring boards are widely used in conformity with the miniaturization of electronic devices. The method for forming the wiring pattern of the printed wiring board is, for example, a semi-additive method. In this semi-additive method, a foundation metal layer is formed on a base film that is mainly made from polyimide, a resist layer is laminated on a front surface of the foundation metal layer, and exposure and development are provided to form a resist pattern. Electroplating is then provided on the foundation metal layer that is exposed in the grooves of the resist pattern so as to form a wiring pattern having an inverted shape of the resist pattern. Thereafter, the resist pattern is peeled off, and the foundation metal layer is etched using the wiring pattern as a mask (see Japanese Laid-Open Patent Publication No. JP-A-2011-171423).

In recent years, the wiring density of printed wiring boards is increasing due to further downsizing of electronic devices. In a printed wiring board having a high wiring density, because the wiring width is minimal, a step of process of securing the cross-sectional area of the wiring is ordinarily performed by providing secondary plating on the wiring pattern scraped by etching the foundation metal layer described above.

BACKGROUND ART

Patent Document

Patent Document 1: Japanese Laid-Open Patent Publication No. 2011-171423

SUMMARY OF THE INVENTION

The printed wiring board according to an aspect of the present invention includes a base film having insulation properties, and a conductive pattern including multiple wiring portions laminated so as to run on at least one surface of the base film, wherein the wiring portions include a first conductive portion and a second conductive portion coating an outer surface of the first conductive portion, wherein an average width of the wiring portion is 10 µm or greater to 50 µm or smaller and an average thickness of the second conductive portion is 1 µm or greater to smaller than 8.5 µm.

A method for manufacturing a printed wiring board according to an aspect of the present invention is a method for manufacturing a printed wiring board including a base film having insulation properties and a conductive pattern including multiple wiring portions laminated so as to run on at least one surface of the base film, that includes a conductive foundation layer laminating step of laminating a conductive foundation layer on one surface of the base film; a photoresist film laminating step of laminating a photoresist film layer on one surface of the conductive foundation layer; a resist pattern forming step of forming a resist pattern having an inverted shape of the conductive pattern is formed by exposure to and development of the photoresist film; a first conductive portion forming step of forming a first conductive portion forming the wiring portions by plating an opening of the resist pattern on the conductive foundation layer; a conductive foundation layer removing step of removing the resist pattern and the conductive foundation layer at a bottom of the resist pattern; and a second conductive portion coating step of coating a second conductive portion on an outer surface of the first conductive portion by plating, wherein an average width of the wiring portion is 10 µm or greater to 50 µm or smaller, and an average thickness of the second conductive portion is 1 µm or greater to smaller than 8.5 µm.

DETAILED DESCRIPTION OF THE INVENTION

Figure 1:
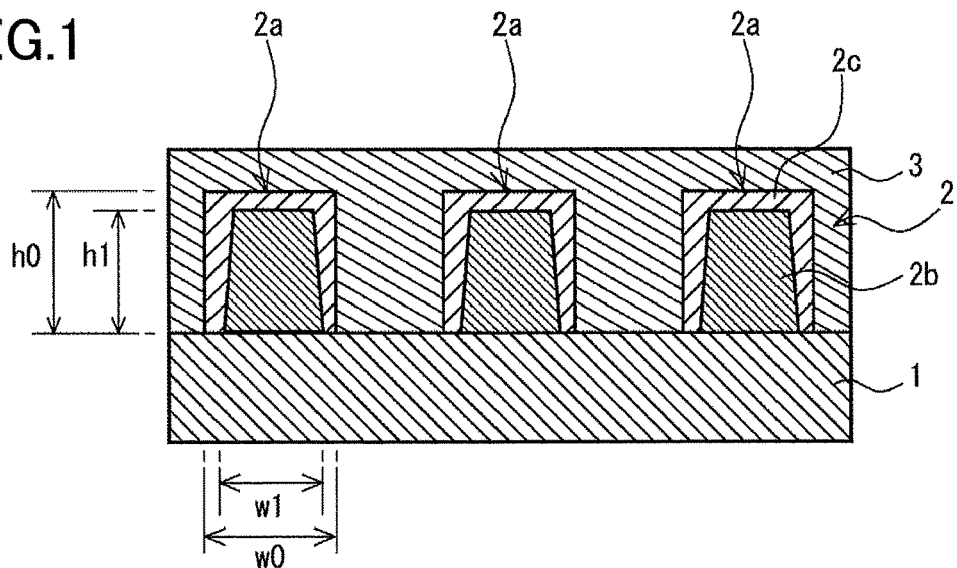
FIG. 1 is a cross-sectional view schematically illustrating a printed wiring board according to an aspect of the present invention.

Problems to be Solved by the Disclosure

Heretofore, high-density printed wiring boards require a certain amount of time for the above secondary plating step, which is one cause to increase the variation in wiring dimensions after secondary plating and the increase in production costs for printed wiring boards. Therefore, it is desirable to shorten a secondary plating step.

The present invention has been made in light of the above circumstances, and it is an object of providing a printed wiring board and a method for manufacturing the same, which can reduce manufacturing costs while minimizing variations in wiring dimensions by shortening the secondary plating step.

Effect of this Disclosure

The printed wiring board and the method for manufacturing the printed wiring board according to one aspect of the present invention can reduce the manufacturing cost while reducing the variation in the wiring dimensions by shortening the secondary plating step.

DESCRIPTION OF EMBODIMENTS OF THE PRESENT INVENTION

The printed wiring board according to an aspect of the present invention includes a base film having insulation properties, and a conductive pattern including multiple wiring portions laminated so as to run on at least one surface of the base film, wherein each of the wiring portions include a first conductive portion and a second conductive portion coating an outer surface of the first conductive portion, wherein an average width of the wiring portion is 10 μm or greater to 50 μm or smaller and an average thickness of the second conductive portion is 1 μm or greater to smaller than 8.5 μm.

The printed wiring board includes a wiring portion is comprised of a first conductive portion formed using a semi-additive method and a second conductive portion formed using secondary plating on the first conductive portion, and the average thickness of the second conductive portion is within the above range. Said differently, in the printed wiring board, the volume of the second conductive portion is small relative to the first conductive portion, and the time required for the secondary plating step can be reduced. Therefore, the variation in the wiring dimensions can be reduced, and the manufacturing cost can be reduced. Because the aspect ratio of the first conductive portion can be relatively small in the printed wiring board, it is possible to prevent the first conductive portion from peeling off during the manufacturing process.

Preferably, the average interval of the multiple wiring portions is equal to or greater than 3 μm to equal to or smaller than 20 μm. By setting the average interval of the multiple wiring portions in the above range, it is possible to shorten the time of the secondary plating step while increasing the wiring density.

The ratio of the average width of the upper surface relative to the average width of the bottom surface of the first conductive portion is preferably equal to or greater than 0.5 to equal to or smaller than 1.0. The ratio of the average width of the upper surface to the average width of the bottom surface of the wiring portion is preferably equal to or greater than 0.7 to equal to or smaller than 1.5. In this way, when the ratio of the average width of the upper surface relative to the average width of the bottom surface of the first conductive portion and the wiring portion is set to the above range, it can be promoted to shorten the time for the secondary plating step.

The ratio of the average height of the above wiring portion relative to the average height of the first conductive portion is preferably equal to or greater than 1.05 to equal to or smaller than 5. As described above, when the ratio of the average height of the wiring portion relative to the average height of the first conductive portion is within the above range, the uniformity of the wiring dimensions can be promoted.

A method for manufacturing a printed wiring board according to an aspect of the present invention is a method for manufacturing a printed wiring board including a base film having insulation properties and a conductive pattern including multiple wiring portions laminated so as to run on at least one surface of the base film, that includes a conductive foundation layer laminating step of laminating a conductive foundation layer on one surface of the base film; a photoresist film laminating step of laminating a photoresist film layer on one surface of the conductive foundation layer; a resist pattern forming step of forming a resist pattern having an inverted shape of the conductive pattern by exposure to and development of the photoresist film; a first conductive portion forming step of forming a first conductive portion forming the wiring portions by plating an opening of the resist pattern on the conductive foundation layer; a conductive foundation layer removing step of removing the resist pattern and the conductive foundation layer at a bottom of the resist pattern; and a second conductive portion coating step of coating a second conductive portion on an outer surface of the first conductive portion by plating, wherein an average width of the wiring portion is 10 μm or greater to 50 μm or smaller, and an average thickness of the second conductive portion is 1 μm or greater to smaller than 8.5 μm.

In the method for manufacturing the printed wiring board, the average thickness of the second conductive portion made with the secondary plating on the first conductive portion formed by the semi-additive method is within the above range. Said differently, in the method for manufacturing the printed wiring board, because the wiring portion is formed while the volume of the second conductive portion is reduced in comparison with the first conductive portion, the time required for the secondary plating step (the second conductive portion coating step) is reduced. As a result, the variation in the wiring dimensions is suppressed, and the cost of manufacturing the printed wiring board can be reduced. Further, in the method for manufacturing the printed wiring board, because the aspect ratio of the first conductive portion can be relatively small, it is possible to prevent the first conductive portion from peeling off during the manufacturing process.

In the above conductive foundation layer removal step, the conductive foundation layer may be removed by etching, and the average etch amount of the first conductive portion described above may be 0.3 μm or greater to smaller than 3.5 μm. By etching the first conductive portion at the average etching amount within the above range, the conductive foundation layer can be removed while saving the etching amount of the first conductive portion. Therefore, it is possible to promote shortening at the time for the secondary plating step.

DETAILED DESCRIPTION OF EMBODIMENTS OF THE PRESENT INVENTION

Hereinafter, a printed wiring board and a method for manufacturing the printed wiring board according to an embodiment of the present invention will be described in detail with reference to the figures. Within the printed wiring board of this embodiment, "front and back" means the thickness directions of the printed wiring board. The thickness direction toward the side of laminating the conductive pattern is called "front" and the thickness direction toward the side opposite to the side of laminating the conductive pattern is called "back".

[Printed Wiring Board]

The printed wiring board illustrated in FIG. 1 mainly includes a base film 1 having insulation properties, a conductive pattern 2 laminated on one side (the front surface side) of the base film 1, and an insulation layer 3 coating the outer surfaces of the base film 1 and the conductive pattern 2.

<Base Film>

The base film 1 is a layer made from a synthetic resin having electrical insulation properties. Further, the base film 1 is provided to form a substrate for forming the conductive pattern 2. The base film 1 may be flexible, in which the printed wiring board is used as a flexible printed wiring board.

The material of the base film 1 is not specifically limited as long as the material has the insulation properties. A synthetic resin film having a low dielectric constant and formed like a sheet can be employed. The main component of the synthetic resin film is, for example, polyimide, polyethylene terephthalate, liquid crystal polymer, fluoropolymer, and the like. The terminology of the "main component" refers to an ingredient that has the highest content occupying, for example, for 50% or more by weight of the material.

The lower limit of the average thickness of the base film 1 is preferably 5 μm, and more preferably 10 μm. The upper limit of the average thickness of the base film 1 is preferably 50 μm, and more preferably 40 μm. If the average thickness of the base film 1 is smaller than the above lower limit, the insulating strength of the base film 1 may be insufficient. On the other hand, if the average thickness of the base film 1 exceeds the above upper limit, the printed wiring board may become unnecessary.

<Conductive Pattern>

The conductive pattern 2 is a layer made from an electrically conductive material and includes multiple wiring portions 2a which are provided so as to run. The wiring portions 2a are, for example, a wiring that forms a coil pattern. The conductive pattern 2 may also include a pattern such as a land portion other than the wiring portion 2a. The conductive pattern 2 may be laminated directly onto the surface of the base film 1 or through an adhesive layer.

The material (the main component) of the conductive pattern 2 is not specifically limited as long as the material has conductivity. However, it is preferable that the material has a low electrical resistance. The conductive pattern 2 may be made from, for example, copper, silver, or the like. The conductive pattern 2 may be plated with gold, silver, tin, nickel, or the like.

Each of the multiple wiring portions 2a includes a first conductive portion 2b and a second conductive portion 2c that coats the outer surface of the first conductive portion 2b. Specifically, the first conductive portion 2b is laminated on the front surface side of the base film 1, has a line-like pattern in its plane view, and forms a frame of the wiring portion 2a. The second conductive portion 2c coats the outer surface other than the surface facing the base film 1 of the first conductive portion 2b (laminated directly on or through another layer to the base film 1), as illustrated in FIG. 1. In other words, the first conductive portion 2b is coated by the base film 1 and the second conductive portion 2c.

The first conductive portion 2b and the second conductive portion 2c are each made of a plating layer formed by plating. The first conductive portion 2b and the second conductive portion 2c may be formed of the same kind of material or may be formed of a different material. In addition, the first conductive portion 2b includes a conductive foundation layer used in the semi-additive method and a plating layer formed on the conductive foundation layer.

The lower limit of the average width w0 of the multiple wiring portions 2a is 10 μm, preferably 15 μm, more preferably 20 μm. On the other hand, the upper limit of the average width w0 of the multiple wiring portions 2a is 50 μm, preferably 45 μm, and more preferably 40 μm. If the average width w0 of the multiple wiring portions 2a is smaller than the lower limit described above, the manufacture may become difficult. On the contrary, if the average width w0 of the multiple wiring portions 2a exceeds the above upper limit, the wiring density may not satisfy the requirement. The "average width of the multiple wiring portions" is the value obtained by averaging the maximum width of the wiring portions in a cross section perpendicular to the longitudinal direction of the wiring portions in the longitudinal direction of the wiring portions, and the same applies to the first conductive section described below. As used herein, an "average value" is the average value of a value measured at multiple points in a measurement object.

As the lower limit of the ratio of the average width of the upper surface to the average width of the bottom surface of the wiring portion 2a, 0.7 is preferable, 0.85 is more preferable, and 0.90 is further preferable. On the other hand, 1.5 is preferable as the upper limit of the ratio, 1.4 is preferable, and 1.3 is further preferable. If the above ratio is smaller than the above lower limit, the cross-sectional area of the wiring portion 2a may be smaller and the resistance may be excessive. On the contrary, if the above ratio exceeds the above upper limit, the wiring portion 2a may easily peel off, and adjacent wiring portions 2a may contact each other, resulting in a short circuit. The "average width of die bottom surface of the wiring section" is the value obtained by averaging the width of the base film side of the cross section perpendicular to the longitudinal direction of the wiring portions in the longitudinal direction of the wiring portions, and the "average width of the top surface of the wiring section" is the value obtained by averaging the width on the opposite side of the base film of the cross sect n the longitudinal direction of the portions, and the same applies to the first conductive section described later.

The lower limit of the average interval d of the multiple wiring portions 2a is preferably 3 μm, more preferably 5 μm, and furthermore preferably 7 μm. Meanwhile, the upper limit of the wiring portions 2a is preferably 20 μm, more preferably 17 μm, and furthermore preferably 15 μm. If the average interval d of the multiple wiring portions 2a is less than the lower limit described above, a short circuit may occur between the wiring portions 2a. On the contrary, if the average interval d of the multiple wiring portions 2a exceeds the above upper limit, the wiring density may not satisfy the requirement. The "average interval of the multiple wiring portions" is the value obtained by averaging the minimum distance between the opposite sides of the adjacent wiring portions in a cross section perpendicular to the longitudinal direction of the wiring section in the longitudinal direction of the wiring section.

As the lower limit of the average height h0 of the multiple wiring portions 2a, 20 μm is preferable, 30 μm is preferable, and 40 μm is further preferable. On the other hand, as the upper limit of the average height h0 of the multiple wiring portions 2a, 100 μm is preferable, 70 μm is preferable, and 50 μm is further preferable. If the average height h0 of the multiple wiring portions 2a is smaller than the lower limit described above, the resistance of the wiring portions 2a may become excessive as the wiring density increases. On the contrary, if the average height h0 of the multiple wiring portions 2a exceeds the above upper limit, the printed wiring board may become unnecessary thicker. The "average height of the multiple wiring portions" is the value obtained by averaging the maximum height of the wiring portions in the longitudinal direction of the wiring portions and in the cross-section perpendicular to the longitudinal direction of the wiring portions, and the same applies to the first conductive portions described below.

As the lower limit of the average aspect ratio of the multiple wiring portions 2a, 1.2 is preferable, 1.4 is preferable, and 1.6 is further preferable. On the other hand, as the upper limit of the average aspect ratio of the multiple wiring portions 2a, 3.0 is preferable, 2.5 is preferable, and 2.0 is further preferable. If the average aspect ratio of the multiple wiring portions 2a is smaller than the lower limit described above, the wiring density may not satisfy the requirement. On the contrary, if the average aspect ratio of the multiple wiring portions 2a exceeds the above upper limit, it may be difficult to manufacture. The "aspect ratio of the multiple wiring portions" is the ratio of the above average height to the above average width, and the same applies to the first conductive part described later.

In the wiring portion 2a forming the coil pattern, it is preferable that the cross-sectional area (average width, average height, and average aspect ratio) of each of the multiple wiring portions 2a are equal.

The lower limit of the average width w1 of the first conductive portions 2b of the multiple wiring portions 2a is preferably 1 µm, more preferably 5 µm, and furthermore preferably 10 µm. Meanwhile, the upper limit of the average width w1 of the first conductive portion 2b is preferably 40 µm, more preferably 30 µm, and furthermore preferably 20 µm. If the average width w1 of the first conductive portion 2b is smaller than the above lower limit, it may be difficult to form a resist pattern, or it may be hard to peel the first conductive portion 2b off from the base film 1. On the contrary, if the average width w1 of the first conductive portion 2b exceeds the above upper limit, the wiring density may not satisfy the requirement, or the resist may become hard to be peeled off.

The lower limit of the ratio of the average width of the upper surface to the average width of the bottom surface of the first conductive portion 2b is preferably 0.5, more preferably 0.65, and furthermore preferably 0.7. On the other hand, the upper limit of the above ratio is preferably 1.0, and more preferably 0.9. If the above ratio is smaller than the lower limit described above, the thickness of the second conductive portion 2c may easily vary to possibly cause it difficult to manufacture the wiring portions 2a. On the contrary, if the above ratio exceeds the above upper limit, it may be possibly difficult to coat the outer surface of the first conductive portion 2b with the second conductive portion 2c.

The lower limit of the average height h1 of the first conductive portion 2b of the multiple wiring portions 2a, preferably 15 µm, more preferably 25 µm, and furthermore preferably 35 µm. Meanwhile, the upper limit of the average height h1 of the first conductive portion 2b is preferably 95 µm, more preferably 65 µm, and furthermore preferably 45 µm. If the average height h1 of the first conductive portion 2b is smaller than the above lower limit, the resulting height of the wiring portion 2a becomes smaller so as to possibly cause the resistance of the wiring portion 2a to become excessive as the wiring density increases. On the contrary, if the average height h1 of the first conductive portion 2b exceeds the above upper limit, the printed wiring board may become unnecessary thicker.

The lower limit of the ratio (h0/h1) of the average height h0 of the wiring portion 2a to the average height h1 of the first conductive portion 2b is preferably 1.05, and more preferably 1.2. On the other hand, the upper limit of the ratio is preferably 5, and more preferably 4. If the above ratio is smaller than the above lower limit, the resulting height of the wiring portions 2a cannot be sufficiently increased, and the resistance of the wiring portions 2a may be excessive. On the contrary, if the above ratio exceeds the above upper limit, the height of the wiring portions 2a may easily vary along the longitudinal direction so as to make it difficult to manufacture the wiring portions 2a.

The lower limit of the average aspect ratio of the first conductive portions 2b of the multiple wiring portions 2a is preferably 2.0, more preferably 2.5, and furthermore preferably 3.0. On the other hand, the upper limit of the average aspect ratio of the first conductive portions 2b is preferably 6.0, more preferably 5.0, and furthermore preferably 4.0. If the average aspect ratio of the first conductive portion 2b is smaller than the lower limit described above, the wiring density may not satisfy the requirement. On the contrary, if the average aspect ratio of the first conductive portions 2b exceeds the above upper limit, it may be difficult to form the resist pattern may be possibly difficult to form or the first conductive portions 2b may be possibly peeled off from the base film 1 with ease.

The lower limit of the average thickness of the second conductive portions 2c is preferably 1 µm, more preferably 5 µm, and furthermore preferably 6 µm, and 7 µm is even more preferred. On the other hand, the average thickness of the second conductive portion 2c is less than 8.5 µm, preferably 8.0 µm at most, and more preferably 7.8 µm at most. If the average thickness of the second conductive portions 2c is smaller than the above lower limit, the resulting height and width of the wiring portions 2a may be reduced so as to possibly make the resistance of the wiring portions 2a excessive. On the other hand, by reducing the average thickness of the second conductive portions 2c so as to be smaller than the above upper limit, the time for the secondary plating can be shortened to reduce dimensional variations and manufacturing costs. The "average thickness of the second conductive portion" is a value obtained by dividing the area of the second conductive portion in the cross-section perpendicular to the longitudinal direction of the wiring portion by the length of the contact surface (interface) between the first conductive portion and the second conductive portion as a thickness, and averaging this thickness in the longitudinal direction of the wiring portion. The length of the above contact surface can be obtained by image analysis of the micrograph.

<Insulation Layer>

The insulation layer 3 is a layer that mainly protects the conductive pattern 2 in the printed wiring board, and commercially available solder resists and cover lay are used. The material of the insulation layer 3 is not specifically limited as long as it has insulation properties. As the main component of the material, a resin such as polyimide, epoxy resin, phenolic resin, acrylic resin, polyester, thermoplastic polyimide, polyethylene terephthalate, fluorinated resin, liquid crystal polymer, and the like can be used.

The lower limit of the average thickness of the insulation layer 3 (the average distance from the surface of the base film 1 to the outer surface of the insulation layer 3) is preferably 25 µm, more preferably 35 µm, and furthermore preferably 45 µm. On the other hand, the upper limit of the average thickness of the insulation layer 3 is preferably 200 µm, more preferably 180 µm, and furthermore preferably 160 µm. If the average thickness of the insulation layer 3 is smaller than the above lower limit, the insulation properties may possibly become insufficient. On the contrary, if the average thickness of the insulation layer 3 exceeds the above upper limit, the printed wiring board may possibly become unnecessarily thicker.

[Method for Manufacturing the Printed Wiring Board]

Figure 2:
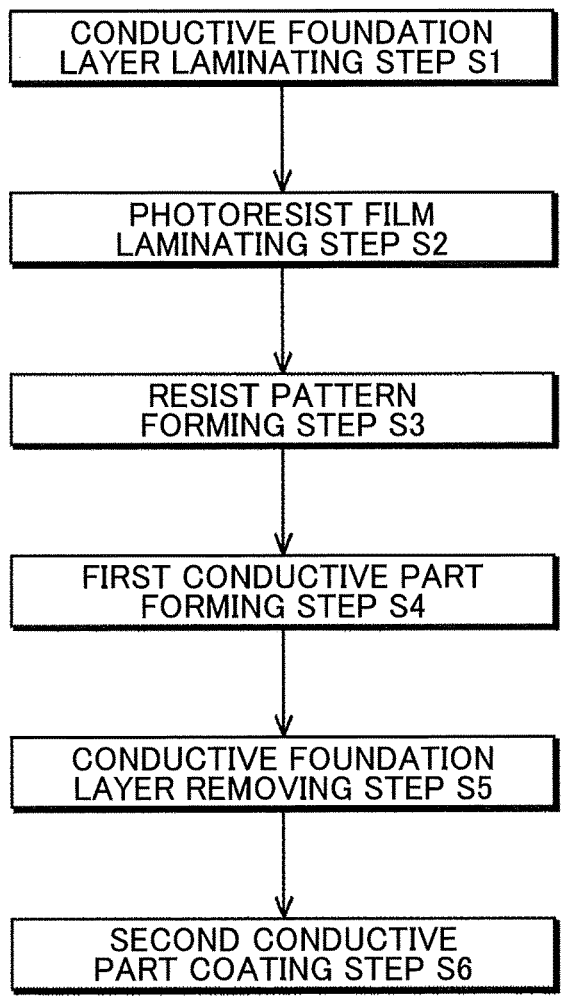
FIG. 2 is a flow diagram illustrating a method for manufacturing the printed wiring board according to the aspect of the present invention.

As illustrated in FIG. 2, the method for manufacturing the printed wiring board mainly includes a conductive foundation layer laminating step S1 for laminating a conductive foundation layer on one surface of the base film, a photoresist film laminating step S2 for laminating a photoresist film on one surface of the conductive foundation layer, a resist pattern forming step S3 for forming a resist pattern having an inverted shape of a conductive pattern by exposure to and development of the photoresist film; a first conductive portion forming step S4 for forming a wiring portion of the conductive pattern by plating an opening of the resist pattern on the conductive foundation layer, a conductive foundation layer removing step S5 for removing the resist pattern and the conductive foundation layer at a bottom of the resist pattern, and a second conductive portion coating step S6 for coating the second conductive portion by plating on an outer surface of the first conductive portion.

<Conductive Foundation Layer Forming Step>

Figure 3A:
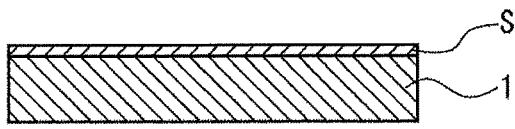
FIG. 3A is a cross-sectional view schematically illustrating one step of the method for manufacturing the printed wiring board according to the aspect of the present invention.

In the conductive foundation layer forming step S1, the conductive foundation layer S is formed on the front surface of the base film 1, as illustrated in FIG. 3A, for example, by electroless plating, application and firing of the metal particle dispersion liquid.

(Conductive Foundation Layer)

The conductive foundation layer S is used as a subject (cathode) for electroplating in the first conductive portion forming step S4, which will be described later.

The lower limit of the average thickness of the conductive foundation layer S is preferably 50 nm, and more preferably 100 nm. On the other hand, the upper limit of the average thickness of the conductive foundation layer S is preferably 2 μm, and more preferably 1.5 μm. If the average thickness of the conductive foundation layer S is smaller than the above lower limit, the first conductive portion 2b may not be formed to have a uniform thickness because the continuity of the conductive foundation layer S cannot be guaranteed. On the contrary, if the average thickness of the conductive foundation layer S exceeds the above upper limit, the cost of manufacturing the printed wiring boards may be unnecessarily increased.

When the conductive foundation layer S is formed by electroless plating, for example, nickel, copper, cobalt, gold, silver, tin, etc., or an alloy thereof can be used as the material of the conductive foundation layer S. Among them, nickel, copper, and cobalt, which can be relatively easily increased in thickness by self-catalyzing, are preferably used.

<Photoresist Film Laminating Step>

Figure 3B:
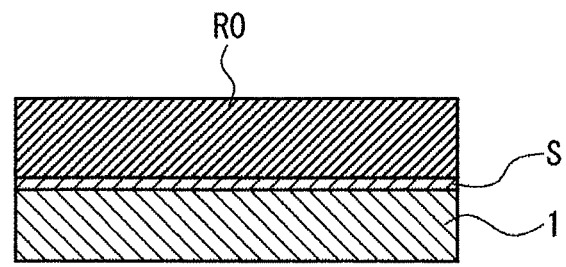
FIG. 3B is a cross-sectional view schematically illustrating another step of the method for manufacturing the printed wiring board according to the aspect of the present invention.

In the photoresist film laminating step S2, a photoresist film R0 is laminated onto the surface of the conductive foundation layer S as illustrated in FIG. 3B.

The photoresist film R0 is made from a negative resist composition, in which the binding of the polymer is strengthened by exposure of light so as to reduce the solubility in the developing liquid, or a positive resist composition in which the binding of the polymer is weakened by exposure of light so as to increase the solubility in the developing liquid.

The photoresist film R0 may be formed on the conductive foundation layer S by coating and drying the liquid resist composition, but it is preferred that the dry film photoresist having no fluidity at room temperature be laminated by thermal pressure deposition. By using dry film photoresist as the photoresist film R0, the thickness of the photoresist film R0 can become uniform and small. Therefore, the miniaturization of the resist pattern can be facilitated.

The lower limit of the average thickness of the photoresist film R0 is preferably 20 μm and more preferably 40 μm. On the other hand, 120 μm is preferred as the upper limit of the average thickness of the photoresist film R0 is preferably 120 μm, and more preferably 80 μm. If the average thickness of the photoresist film R0 is smaller than the above lower limit, the dry film resist may not be easily handled. On the other hand, if the average thickness of the photoresist film R0 exceeds the above upper limit, the accuracy of the shape of the resist pattern may be reduced.

<Resist Pattern Forming Process>

In the resist pattern forming step S3, at first, by selectively exposing the photoresist film R0 to light using a photomask or the like, for example, the photoresist film R0 is formed to have a part dissolved in the developing liquid and a part not dissolved in the developing liquid.

Figure 3C:
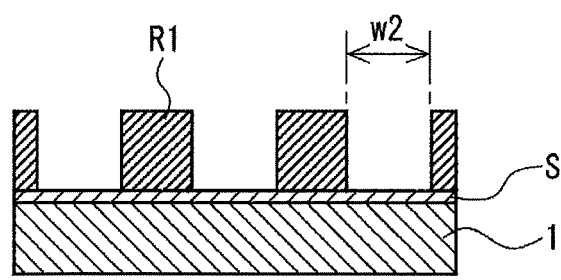
FIG. 3C is a cross-sectional view schematically illustrating another step of the method for manufacturing the printed wiring board according to the aspect of the present invention.

Subsequently, a part of the photoresist film R0, which is highly soluble, is washed off using the developer to obtain a resist pattern R1, in which a part corresponding to the first conductive portion 2b to be formed is an opening as illustrated in FIG. 3C.

The resist pattern R1 has multiple openings defining the first conductive portions 2b.

The lower limit of the average width w2 of the openings is preferably 5 μm, more preferably 10 μm, and furthermore preferably 15 μm. Meanwhile, the upper limit of the average width w2 of the opening is preferably 45 μm, more preferably 35 μm, and furthermore preferably 25 μm. If the average width w2 of the openings is smaller than the above lower limit, the width of the opening may vary considerably. In addition, the thickness (the amount of secondary plating) of the second conductive portion 2c may fall outside the above range so as to cause variations in the dimensions and increase in the cost of manufacturing the printed wiring board. On the contrary, if the average width w2 of the openings exceeds the above upper limit, the resist pattern R1 may easily peel off, and the wiring density may not satisfy the requirement. The average width of the opening corresponding to the first conductive portion 2b of the resist pattern R1 is the same as the average width of the first conductive portion 2b before etching in the conductive foundation layer removal step S5 described later.

<First Conductive Portion Forming Step>

Figure 3D:
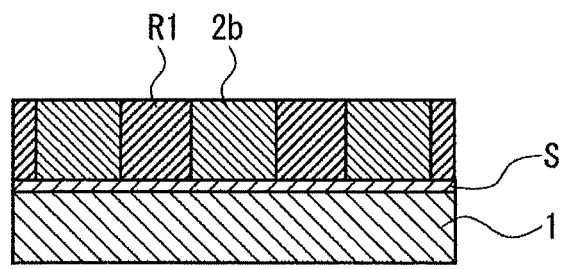
FIG. 3D is a cross-sectional view schematically illustrating another step of the method for manufacturing the printed wiring board according to the aspect of the present invention.

In the first conductive portion forming step S4, the first conductive portion 2b is formed as illustrated in FIG. 3D by laminating the metal to the conductive foundation layer S exposed in the opening of the resist pattern R1 by electroplating. The first conductive portion 2b comprises a plating layer formed by electroplating and a conductive foundation layer S.

Specifically, in the first conductive portion forming step S4, the base film 1, the conductive foundation layer S, the laminated body of the resist pattern R1, and the electrode facing the laminated body of the resist pattern R1 are disposed in the electrolyte solution, a negative electrode of a DC power supply is connected to the conductive foundation layer S, and a positive electrode is connected to an opposite electrode, so that metal in the electrolyte is deposited on the surface of the conductive foundation layer S.

As the metal that is laminated by the electroplating, that is, the metal that forms the first conductive portions 2b, for example, copper, nickel, gold, silver, platinum, and the like can be used. Among these, copper that is relatively inexpensive and has excellent conductivity and nickel that is relatively inexpensive and has excellent corrosion resistance are preferably used.

As the lower limit of the average height of the first conductive portion 2b before etching formed in the first conductive portion forming step S4, 20 μm is preferable, 30 μm is preferable, and 38 μm is further preferable. On the other hand, the upper limit of the average height of the first conductive portion 2b before etching is preferably 100 μm, more preferably 70 µm, and furthermore preferably 50 µm. If the average height of the first conductive portion 2b before etching is less than the lower limit above, the thickness of the second conductive portion 2c (the amount of secondary plating) may deviate from the above range, resulting in variations in dimensions and increases in the cost of manufacturing the printed wiring board. On the contrary, if the average height of the first conductive portion 2b before etching exceeds the above upper limit, the resist may become difficult to peel off, or the printed wiring board may become unnecessarily thicker.

<Conductive Foundation Layer Removing Step>

Figure 3E:
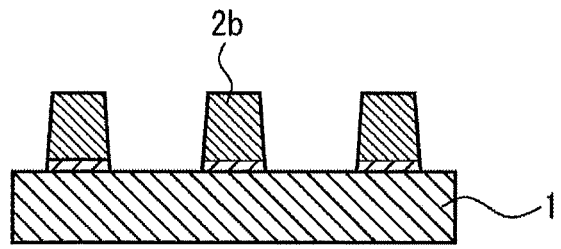
FIG. 3E is a cross-sectional view schematically illustrating another step of the method for manufacturing the printed wiring board according to the aspect of the present invention.

In the conductive foundation layer removing step S5, the resist pattern R1 and the conductive foundation layer S at the bottom thereof are removed after forming the first conductive portion 2b as illustrated in FIG. 3E.

The resist pattern R1 is removed by peeling the resist pattern R1 from the conductive foundation layer S. Specifically, the laminate including the resist pattern R1, the first conductive portion 2b, the conductive foundation layer S, and the base film 1 is immersed in a peeling liquid so that the resist pattern R1 is inflated using the peeling liquid. This causes repulsive force between the resist pattern R1 and the conductive foundation layer S, and the resist pattern R1 peels away from the conductive foundation layer S. A known peeling liquid may be used.

The conductive foundation layer S at the bottom of the resist pattern is removed by etching the conductive foundation layer S exposed after peeling off the resist pattern using the first conductive portion 2b as a mask. Thus, the multiple first conductive portions 2b are electrically separated. This etching uses an etchant that erodes the metal forming the conductive foundation layer S.

The etching amount may be the amount at which the conductive foundation layer S is completely removed. However, in the method for manufacturing the printed wiring board, the average etching amount of the first conductive portion 2b is preferably 0.3 µm or greater to smaller than 3.5 µm. More preferably, the average etching amount is 2.0 µm or smaller. By setting the above average etching amount to the above range, the ratio of the average width of the upper surface to the average width of the bottom surface of the first conductive portion 2b can be set to 0.5 or greater to 1.0 or smaller, and because the size of the first conductive portion 2b after etching can be increased, it is possible to promote a time reduction of the secondary plating step. The "average etching amount of the first conductive portion" is an average value of averaging a thickness, which is obtained by dividing the difference between the area of the first conductive portion before etching and the area of the first conductive portion after etching on the cross-section perpendicular to the wiring portion by the length of the outer surface of the first conductive portion before etching (excluding the laminated surface with a base film), in a longitudinal direction of the wiring portion.

<Second Conductive Portion Coating Step>

In the second conductive portion coating step S6, the second conductive portion 2c is coated on the outer surface of the first conductive portion 2b by plating so as to form the wiring portion 2a. The plating can be performed by, for example, a known electroplating method. Accordingly, the printed wiring board illustrated in FIG. 1, in which the average width of the wiring portion 2a is 10 µm or greater to 50 µm or smaller and the average thickness of the second conductive portion 2c is 1 µm or greater to smaller than 8.5 µm, is obtained.

Advantages

The printed wiring board includes the wiring portions 2a made of the first conductive portions 2b formed by the semi-additive method and the second conductive portions 2c formed by the secondary plating on the first conductive portions 2b, and the average thickness of the second conductive portions 2c is in the above range. In other words, because the volume of the second conductive portion 2c is small relative to the first conductive portion 2b and a time required for the secondary plating step can be reduced in the printed wiring board, the variation in the wiring dimensions can be suppressed and the manufacturing cost can be reduced. Further, in the method for manufacturing the printed wiring board, the aspect ratio of the first conductive portion 2b can be relatively small, so that the first conductive portion 2b can be prevented from peeling off during manufacturing.

Because the wiring density of the printed wiring board is improved to be high while maintaining the accuracy of the wiring dimensions, the printed wiring board can be suitably used for an actuator, an antenna, a transformer, or the like of a small device.

Other Embodiments

The embodiments disclosed herein are exemplary in all respects and should not be considered limiting. The scope of the present invention is not limited to the structures of the above embodiments, is recited by the claims, and is intended to include all changes within the meaning and scope of equivalence to the claims.

Although the above embodiment has described a printed wiring board having a single base film and a conductive pattern of one layer laminated onto one surface of the base film, it is within the scope of the present invention that a conductive pattern is laminated to both surfaces of the single base film. Further, the printed wiring board may be a multilayer printed wiring board including multiple base films, each base film having a conductive pattern on one or both surfaces.

EXPLANATION OF NUMERICAL REFERENCES

1 Base film
2 Conductive pattern
2a Wiring portion
2b First conductive portion
2c Second conductive portion
3 Insulation layer
R0 Photoresist film
R1 Resist pattern
S Conductive foundation layer
S1 Conductive foundation layer laminating step
S2 Photoresist film laminating step
S3 Resist pattern forming step
S4 First conductive portion forming step
S5 Conductive foundation layer removing step
S6 Second conductive portion coating step
w0 Average width of wiring portion
w1 Average width of first conductive portion
w2 Average width of opening portion
h0 Average height of wiring portion
h1 Average Height of first conductive portion

What is claimed is:

1. A printed wiring board comprising:
   a base film having insulation properties; and
   a conductive pattern including a plurality of wiring portions laminated so as to run on at least one surface of the base film,
   wherein each wiring portion includes a first conductive portion and a second conductive portion coating an outer surface of the first conductive portion, the second conductive portion surrounding the first conductive portion,
   wherein the first conductive portion has a tapered shape, in which an average width of the first conductive portion increases in a direction from an upper surface of the first conductive portion to a bottom surface of the first conductive portion,
   wherein a ratio of an average width of an upper surface of each wiring portion relative to an average width of a bottom surface of each wiring portion is 0.9 to 1.3, and
   wherein an average width of each wiring portion is 10 μm or greater to 50 μm or smaller, and an average thickness of the second conductive portion is 1 μm or greater to smaller than 8.5 μm.

2. The printed wiring board according to claim 1, wherein an average interval of each wiring portion is 3 μm or greater to 20 μm or smaller.

3. The printed wiring board according to claim 1, wherein a ratio of the average width of the upper surface of the first conductive portion to the average width of the bottom surface of the first conductive portion is 0.5 or greater to smaller than 1.0.

4. A printed wiring board according to claim 1, wherein a ratio of an average height of each wiring portion to an average height of the first conductive portion is 1.05 or greater to 5 or smaller.

5. The printed wiring board according to claim 1, wherein each wiring portion substantially has a non-tapered shape, in which the average width of each wiring portion is substantiality the same through the upper surface of each wiring portion and the bottom surface of each wiring portion.

6. The printed wiring board according to claim 1, wherein the first conductive portion has a pair of side surfaces, and the second conductive portion is laminated on each of the pair of side surfaces.

7. The printed wiring board according to claim 1, wherein the first conductive portion has a pair of side surfaces and a top surface continuously formed from the pair of side surfaces, and
   wherein the second conductive portion is laminated on each of the pair of side surfaces and the top surface.

8. The printed wiring board according to claim 1, wherein the first conductive portion includes a conductive foundation layer laminated on the at least one surface of the base film, and an average thickness of the conductive foundation layer is 50 nm or greater to 2 μm or smaller.

* * * * *